US009362162B2

(12) United States Patent
Singh et al.

(10) Patent No.: US 9,362,162 B2
(45) Date of Patent: Jun. 7, 2016

(54) METHODS OF FABRICATING BEOL INTERLAYER STRUCTURES (71) Applicant: GLOBALFOUNDRIES Inc., Grand Cayman, KY (US)

(72) Inventors: Sunil Kumar Singh, Mechanicville, NY (US); Ravi Prakash Srivastava, Clifton Park, NY (US); Teck Jung Tang, Ballston Lake, NY (US); Mark Alexander Zaleski, Galway, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 49 days.

(21) Appl. No.: 14/459,444

(22) Filed: Aug. 14, 2014

(65) Prior Publication Data
US 2016/0049327 A1   Feb. 18, 2016

(51) Int. Cl.
*H01L 21/44* (2006.01)
*H01L 21/768* (2006.01)

(52) U.S. Cl.
CPC .... *H01L 21/76802* (2013.01); *H01L 21/76877* (2013.01)

(58) Field of Classification Search
CPC ................ H01L 23/5329; H01L 23/5226
USPC ........................... 257/758; 438/666
See application file for complete search history.

(56) References Cited

U.S. PATENT DOCUMENTS

| 6,114,233 | A  | * | 9/2000 | Yeh ............... | H01L 21/76801 257/E21.267 |
| 6,271,127 | B1 | * | 8/2001 | Liu ................ | H01L 21/7681 257/E21.579 |
| 6,399,478 | B2 | * | 6/2002 | Matsubara ........ | H01L 21/76825 257/E21.579 |
| 6,444,136 | B1 | * | 9/2002 | Liu .................. | H01L 21/02134 216/17 |
| 7,682,963 | B2 |   | 3/2010 | Chen et al. | |
| 2009/0091038 | A1 | | 4/2009 | Chen et al. | |
| 2014/0259652 | A1 | * | 9/2014 | Pushpala .......... | G01N 27/3271 29/825 |
| 2015/0076705 | A1 | * | 3/2015 | Singh .................. | H01L 23/481 257/774 |

OTHER PUBLICATIONS

Singh et al., "Reduced Capacitance Interlayer Structures and Fabrication Methods", U.S. Appl. No. 14/027,479, filed Sep. 16, 2013 (30 pages).

* cited by examiner

*Primary Examiner* — Jami M Valentine
(74) *Attorney, Agent, or Firm* — Heslin Rothenberg Farley and Mesiti PC; Nicholas Mesiti (57) ABSTRACT Methods are provided for fabricating an interlayer structure useful in, for instance, providing BEOL interconnect for circuit structures. The method includes, for instance, providing an interlayer structure, including: providing an uncured insulating layer above a substrate structure; forming an energy removal film over the uncured insulated layer; forming at least one opening through the energy removal film and extending at least partially into the uncured insulating layer; and applying energy to cure the uncured insulating layer, establishing a cured insulating layer, and decomposing in part the energy removal film, establishing a reduced thickness, energy removal film over the cured insulating layer, the interlayer structure including the cured insulating layer, and the applying energy decreasing an aspect ratio(s) of the one opening(s). In one implementation, the uncured insulating layer includes porogens which also decompose partially during applying energy to further improve the aspect ratio(s).

20 Claims, 6 Drawing Sheets

METHODS OF FABRICATING BEOL INTERLAYER STRUCTURES

FIELD OF THE INVENTION

The present invention relates to methods of facilitating fabricating integrated circuits, and more particularly, to methods for improving metal fill and metal resistance uniformity in interconnect layers of an integrated circuit.

BACKGROUND OF THE INVENTION

As the density of semiconductor integrated circuits continues to increase and the corresponding size of circuit elements decreases, fabrication yields and device performance issues continue to arise. For instance, as pitch between metal fill vias and/or trenches in back end of line (BEOL) interconnect structures continues to decrease, metal fill issues are arising or becoming more significant due, in part, to higher desired aspect ratios of the structures. Further, as circuit size decreases, performance may be dominated by interconnect resistive-capacitive (RC) delay, for instance, between interconnect layers. Accordingly, enhanced interconnect and enhanced interlayer structures and fabrication methods are needed.

BRIEF SUMMARY

The shortcomings of the prior art are overcome, and additional advantages are provided through the provision, in one aspect, of a method of fabricating an interlayer structure which includes: providing an uncured insulating layer above a substrate structure; forming an energy removal film over the uncured insulating layer; forming at least one opening through the energy removal film and extending at least partially into the uncured insulating layer; and applying energy to cure the uncured insulating layer, establishing a cured insulating layer, and decomposing in part the energy removal film, establishing a reduced energy removal film over the cured insulating layer, the interlayer structure including the cured insulating layer, and the applying energy decreasing an aspect ratio(s) of the at least one opening.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

In semiconductor technology, an integrated circuit may be formed on a semiconductor substrate according to a particular technology node, which typically indicates a minimum feature size. The minimum feature size dictates spacing, for instance, for multilayer interconnections, such as multilayer copper interconnections, including vertical interconnection vias and horizontal interconnection metal lines, provided during back end of line (BEOL) processing of the integrated circuit. As technology nodes continue to reduce feature size, fabrication yields and device performance issues are rising. For instance, reduced feature size may result in a pitch which requires vertical interconnects with high aspect ratio(s), resulting in metal fill issues during fabrication. Further, resistive-capacitive (RC) interconnect delay becomes more significant as feature size decreases. High RC delay may be, in part, the result of reactive ion etching or wet-etch cleaning damage to the interlayer dielectric during interconnect formation, which may result in degraded performance of the integrated circuit being fabricated. Further, metal resistance and metal non-uniformity may become an issue due to polish selectivity of, for instance, copper interconnect to the interlayer dielectric material, such as a low-k material or ultra low-k material.

Advantageously, provided herein are interlayer and interconnect fabrication processes which improve resistance characteristics by limiting resistance non uniformity, and improve interconnect resistive-capacitive (RC) performance by decreasing etch and planarization damage to the interlayer material. Advantageously, the fabrication processes disclosed herein also decrease aspect ratio (AR) of via openings and trench openings used in back end of line interconnect processing, which enhances the metal filling process as minimum feature size narrows, thereby improving yield and reducing defects in the integrated circuit structures formed. The fabrication processing presented will improve chip package interaction (CPI), by reducing interconnect stress, improving reliability performance, and can be applied to any technology node, including, for instance, the 28 nm technology node and below.

Generally stated, provided herein, in one aspect, is a method of fabricating an interlayer structure, which includes: providing an uncured insulating layer above a substrate structure; forming an energy removal film over the uncured energy layer; forming at least one opening through the energy removal film and extending at least partially into the uncured insulating layer; and applying energy to cure the uncured insulating layer, establishing a cured insulating layer, and decomposing in part the energy removal film, establishing a reduced energy removal film over the cured insulating layer, the interlayer structure including the cured insulating layer and the applying energy decreasing an aspect ratio(s) of the at least one opening.

In one example, the insulating layer, and in particular, the cured insulating layer, has an effective dielectric constant of, for instance, 2.7, or below. The uncured insulating layer, which may be a low-k or ultra-low-k dielectric material, may be formed of porogens plus a matrix material, with the porogens also decomposing at least in part with the applying energy to cure the uncured insulating layer. The cured insulating layer may have a reduced thickness compared with a thickness of the uncured insulating layer prior to applying the energy, thereby further decreasing the aspect ratio(s) of the at least one opening. In one implementation, the energy removal film decomposes to a greater degree than the uncured insulating film during the applying energy. As a specific example, the porogens of the uncured insulating layer may be a C-based polymer material, and the matrix material may be a silicon-based material.

In a further embodiment, the energy removal film may include a C-based polymer material, and the applying energy may result in the reduced energy removal film having a reduced thickness that is 50% or less of a thickness of the energy removal film prior to the applying energy. For instance, the reduced thickness of the reduced energy removal film may be 25% or less the thickness of the energy removal film prior to the applying energy.

As one example, the energy removal film and the insulating layer may be different materials. For instance, the energy removal film may include a C-based polymer material, but lack the matrix material of the insulating layer. Thus, the energy removal film thickness decreases to a greater extent than the insulating layer thickness during the applying energy to cure the uncured insulating layer. The thickness of the insulating layer and the energy removal film decreasing during the applying energy advantageously results in decreased aspect ratio(s) for the at least one opening provided in the interlayer structure.

In general, forming the energy removal film may include forming the energy removal film from at least one of a photonic decomposable material, a thermal decomposable material, an e-beam decomposable material, or a combination thereof. Applying energy to cure the uncured insulating layer and partially decompose the energy removal film may include utilizing one or more of thermal energy, x-ray energy, ultra-violet light energy, or infrared light energy.

In one implementation, providing the interlayer structure may further include, after applying the energy, over filling the at least one opening with a conductive material, and planarizing an exposed surface of the interlayer structure after the over filling of the at least one opening with the conductive material. Advantageously, the reduced energy removal film may be used an etch stop for the planarizing. In one example, the reduced energy removal film may be about 5 nanometers or less in thickness (for instance, have a thickness in the range of 2-3 nanometers), and be removed by the planarizing of the exposed surface of the interlayer structure.

In another implementation, providing the interlayer structure may include providing a conductive material within the at least one opening to form a conductive structure, and the substrate structure may include a metal layer disposed above a substrate of the substrate structure, with the conductive structure extending, at least in part, to the metal layer. Further, the method may include disposing another metal layer over the interlayer structure, where the conductive structure facilitates electrical connection between the metal layer and the another metal layer. By way of example, the substrate structure may further include a device layer disposed below the metal layer, and the conductive structure may facilitate electrical connection between the another metal layer and the device layer.

Reference is made below to the drawings, which are not drawn to scale for ease of understanding, wherein the same reference numbers used throughout different figures designate the same or similar components.

Figure 1A:
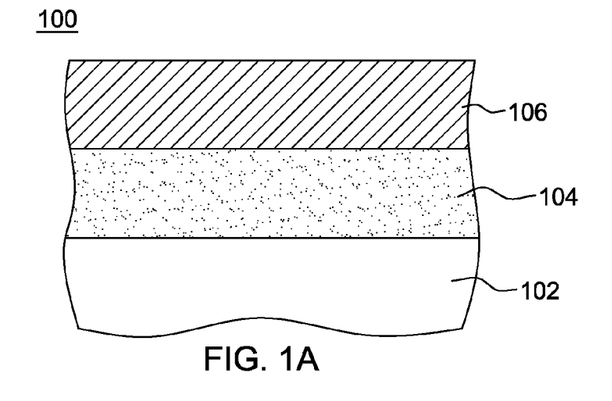
FIG. 1A depicts a partial cross-sectional elevation view of one embodiment of a structure, which includes a metal layer, and is obtained during a fabrication process, in accordance with one or more aspects of the present invention.

FIG. 1A illustrates a partial cross-sectional elevation view of a structure 100 obtained during fabrication of one or more interlayer structures, in accordance with one or more aspects of the present invention. In the example shown, structure 100 includes a substrate 102, which may be (in one example) a bulk semiconductor material such as a bulk silicon wafer. As another example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement insulator (SRI) substrates and the like, and may be n-type or p-type doped. Substrate 102 might be, for instance, approximately 600-700 micrometers thick, as one example only.

During front-end of line (FEOL) processing, individual devices are created, for instance, in a device layer 104, such as, for example, metal-oxide-semiconductor field-effect transistors (MOSFETs) or FinFETs, as well as capacitors, resistors, and other semiconductor devices. These devices may be formed using various techniques, and their formation may include several steps of processing such as creating surface structures, isolating devices with shallow or deep trenches, forming n-type and p-type wells, providing gate structures, and fabricating source and drain conductive contact structures. Through these techniques, individual, unconnected (or partially connected) semiconductor devices may be fabricated in device layer 104.

After FEOL processing, as well as middle-of-the-line (MOL) processing, BEOL processing is performed, including, for example, silicidation of source and drain regions, deposition of a pre-metal dielectric (PMD) layer, and formation of vias or trenches in the PMD layer. During BEOL processing, a layer of a conductive material such as metal layer 106 (e.g., metal 1 layer), may be deposited and patterned into a network of interconnecting lines or wiring, for instance, to facilitate the desired interconnection of semiconductor devices in device layer 104 as required to implement an integrated circuit design. The deposition of metal layer 106, followed by subsequent processing to pattern, etch, and fill trenches and vias with conductive structures, may be repeated during BEOL processing such that several metal layers, for example, between six and ten metal layers, are deposited and processed in a similar manner. Between each metal layer, interlayer structures may be formed to isolate signals from the various metal layers and to support structural integrity of the integrated circuit structure, including the metal layers and the interconnecting conductive structures such as trenches or vias. As an example, the interlayer structures may include one or more interlayer dielectrics.

Figure 1B:
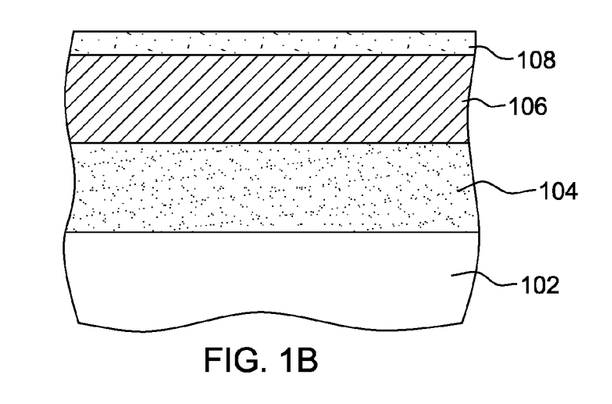
FIG. 1B depicts the structure of FIG. 1A after providing a protective hard mask layer over the structure, in accordance with one or more aspects of the present invention.

FIG. 1B illustrates structure 100 of FIG. 1A after providing a protective hard mask layer 108 over metal layer 106, such as a layer of nitrogen-doped and hydrogen-doped silicon carbide material, or N-Blok (also referred to as a nitride barrier for low-k), which typically has 10% mol to about 25% mol of nitrogen dopant, and which may be deposited using, for instance, chemical-vapor deposition (CVD) processing. By way of example, protective hard mask layer 108 may be 5-25 nm thick.

Figure 1C:
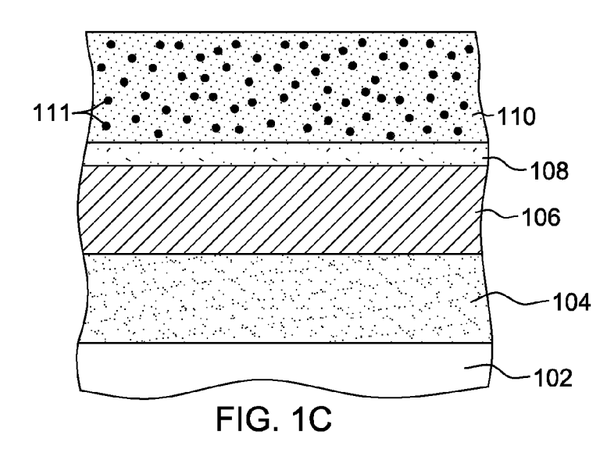
FIG. 1C depicts the structure of FIG. 1B after disposing an uncured insulating layer including porogens over the structure, in accordance with one or more aspects of the present invention.

FIG. 1C illustrates the structure of FIG. 1B after providing an insulating layer 110 over the structure. Insulating layer 110 may be, in one embodiment, an uncured dielectric layer having porogens 111. Porogens 111 are particles that may be degraded, or removed, leaving pores, using, for example, a thermal, ultra-violet (UV), or other curing process such as discussed below. Porogens 111, which may be nanopores, may be roughly spherical in shape, or may have irregular shapes and sizes, and may or may not be uniformly dispersed within insulating layer 110. In another embodiment, insulating layer 110 may include, for example, a matrix-porogen system, wherein porogens, are dispersed in a matrix material. In one example, some porogens 111 may be in direct contact with one another, while in another example, porogens 111 may be uniformly distributed. Insulating layer 110 may be deposited from a gaseous phase using CVD, such as, for example, plasma-enhanced CVD (PECVD), or from a liquid phase using a spin-on deposition process, and by way of example, may have a thickness in the range of 30-60 nanometers. Further, porogens 111 may have a diameter or critical dimension of approximately 1 to 3 nanometers. Porogens 111 may be, for example, a terpinene material, such as a-terpinene (ATRP), or may be a cyclodextrin material, such as b-cyclodextrin (BCD). In another example, porogens 111 may be any commercially available gas or liquid pore-forming material, including any C-based material such as Porogen A. The matrix of the porogen-matrix material may be or include a silicon-based material.

Figure 1D:
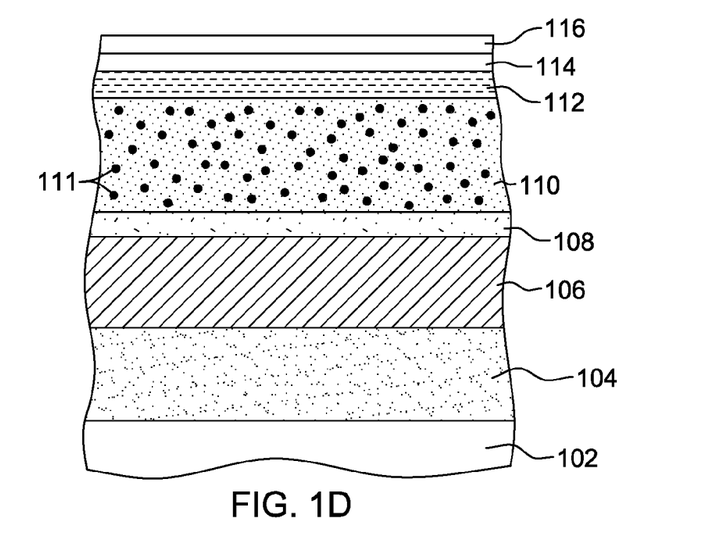
FIG. 1D depicts the structure of FIG. 1C after disposing an energy removal film (ERF), and multiple protective layers over the structure, in accordance with one or more aspects of the present invention.

As illustrated in FIG. 1D, an energy removal film (ERF) 112 is provided over the structure as a hard mask, along with one or more protective layers, such as a metal hard mask layer 114, for instance, a titanium nitride, tantalum, etc., layer, and a dielectric material hard mask layer 116, for instance, a TEOS, SiON, SiCN, etc., layer, or more generally, formed of any conventional dielectric material having the desired etch-selectivity.

The energy removal film (ERF) 112 may be provided using an energy removal material, which is a material decomposable upon being exposed to a proper energy, such as ultra-violet (UV), x-ray, infrared, visual light, thermal energy, electron beam (e-beam), and/or other proper energy sources. For example, one energy removal material is decomposable to e-beam, with electron energy ranging between about 100 eV and about 500K eV. The energy removal material may include a photonic decomposable material, a thermal decomposable material, or an e-beam decomposable material. In one implementation, ERF 112 includes an organic compound, for instance, a C-based material. Thus, in one implementation, ERF 112 is a different material than uncured insulating layer 110. (Note that alternatively, ERF 112 and uncured insulating layer 110 could be similar decomposable materials, with different thicknesses to the provided layers.) In one implementation, ERF 112 includes porogens, and uncured insulating layer 110 includes porogens in a matrix material, with the result being that ERF 112 decomposes to a greater degree when energy is applied than uncured insulating layer 110. By way of example, ERF 112 may have a thickness of 10-30 nm, and be formed by a suitable process, such as chemical-vapor deposition (CVD).

Metal hard mask layer 114 and dielectric hard mask layer 116 may be provided using any conventional process. For instance, the deposition processes of metal hard mask layer 114 and dielectric hard mask layer 116 may include low-temperature CVD, plasma-enhanced CVD (PECVD), or atomic layer deposition (ALD). As noted, in one specific example, metal hard mask layer includes a titanium nitride, tantalum, etc., layer, and the dielectric hard mask layer is any conventional dielectric material having the desired etch-selectivity, such as TEOS, silicon oxy-nitride (SiON), silicon carbon-nitride (SiCN), and the like.

Patterning of the structure of FIG. 1D may be accomplished using any suitable lithography process. Following patterning, material removal may be performed by, for example, any suitable etching process, such as an anisotropic dry etching process, for instance, reactive-ion-etching (RIE) in a $C_xF_y$ gas. When an etchant that is selective to the material of protective layer 108 is used, etching will naturally be stopped at protective layer 108, protecting materials therebelow. Protective layer 108 may then be selectively removed, for instance, using a different etch chemistry, for example dry etching.

Figure 1E:
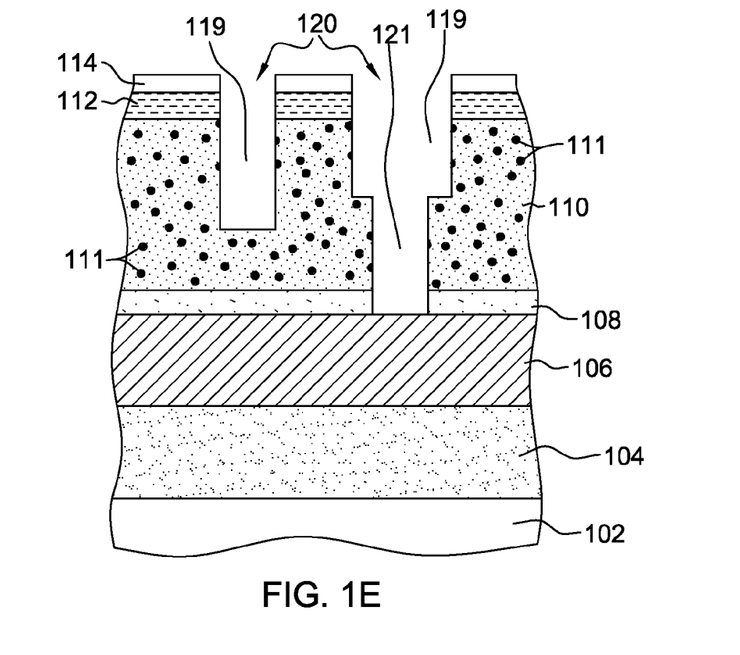
FIG. 1E depicts the structure of FIG. 1D after patterning and etching the structure, removing one of the protective layers, and forming one or more openings extending through the energy removal film and into the uncured insulating layer, in accordance with one or more aspects of the present invention.

FIG. 1E illustrates the structure of FIG. 1D after one example of patterning and etching, which results in removal of dielectric hard mask layer 116 (see FIG. 1D), as well as respective portions of metal hard mask layer 114, energy removal film 112, and uncured insulating layer 110 to form openings 120. By way of example, openings 120 may include one or more trenches 119 and vias 121 extending into the interlayer structure, for instance, into and/or through the uncured insulating layer 110 and the protective hard mask 108 to metal layer 106. Openings 120 may further include one or more trenches 119 extending into the uncured insulating layer 110. Openings 120 may be filled with conductive structures to, for example, facilitate interconnection, including vertical interconnection between BEOL metal layers, of an integrated circuit, as explained further below.

Figure 1F:
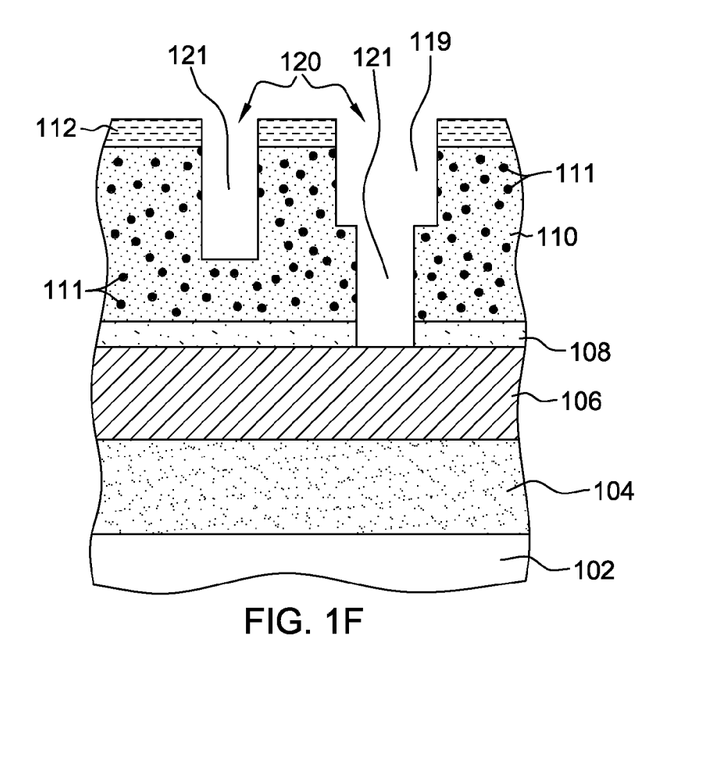
FIG. 1F depicts the structure of FIG. 1E after removal of any remaining protective layer(s) over the structure, in accordance with one or more aspects of the present invention.
Figure 1G:
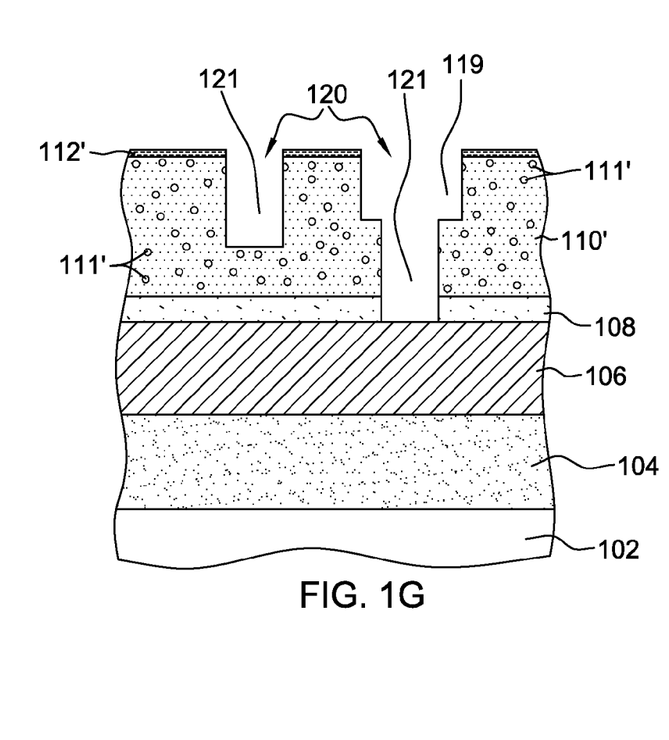
FIG. 1G depicts the structure of FIG. 1F after applying energy to the structure to cure the uncured insulating layer and partially decompose the energy removal film to decrease the aspect ratio(s) of the one or more openings within the structure, in accordance with one or more aspects of the present invention.

FIG. 1F depicts the structure of FIG. 1E after removal of the metal hard mask layer 114 (see FIG. 1E) using, for instance, a wet-clean process. As a result of the patterning, etching, and wet-clean processing, damage may occur to the sidewalls of openings 120, for instance, resulting from depletion of carbon at or adjacent to the sidewalls of the openings. Advantageously, and as explained below, this damage is at least partially repaired by applying energy to the structure to concurrently cure uncured insulating layer 110, establishing a cured insulating layer 110', and decompose (in part) energy removal film 112, establishing a reduced energy removal film 112' over cured insulating layer 110', as illustrated in FIG. 1G. As depicted, reducing thickness of uncured insulating layer 110 to that of cured insulating layer 110', and reducing thickness of energy removal layer 112 by decomposing to reduced energy removal layer 112', advantageously decreases aspect ratio(s) of the openings 120 formed within the structure, which improves subsequent metal fill of the openings. In one implementation, the energy removal film 112 is decreased to a reduced energy removal film that is approximately 5-50% of the original thickness of the energy removal film before the energy is applied. In one example, where the ERF has a starting thickness of 10-30 nm, the energy applied may decrease ERF thickness to about 20% of the original ERF material thickness, for instance, to a thickness of about 2-6 nm.

The energy applied to the structure to cure the uncured insulating layer and reduce the energy removal film may include ultra-violet (UV), x-ray, infrared, visual light, thermal energy, electron-beam (e-beam), and/or other proper energy sources. One exemplary energy source applied to ERF 112 and uncured insulating layer 110 includes ultra-violet light. The energy applied may have a certain duration in combination with a certain type of energy to achieve the desired partial removal of porogens from the ERF material and the uncured insulating layer. In one embodiment, thermal energy is implemented, with a temperature ranging between about 100° C. and about 600° C., and/or a duration from about a 1 minute to about 20 minute period. In another implementation, ultra-violet energy is implemented, with a temperature ranging between about 100° C. and about 600° C., and/or a duration of about 1 minute to about 10 minute period. In a further example, an electron-beam may be applied, with the electron energy ranging between 100 electron-volts (eV) and 500 keV. In another example, depending upon the materials and thickness used, approximately two to three minutes of UV light could be sufficient to achieve the desired curing of interlayer structure 115.

The ERF, upon being exposed to the applied energy, is partially removed, resulting in a reduced ERF 112', and the uncured insulating layer 110 is cured, resulting in a cured insulating layer 110'. Note that porogens within the uncured insulating layer also decompose with the applying energy, and the energy applied to the insulating layer facilitates repair of the sidewalls of openings 120 by adjusting, for instance, carbon composition at the sidewalls as a result of the energy applied to the structure, breaking bonds within the insulating layer. For instance, by establishing a temperature of about 400° C., carbon within the insulating layer can be freed to move towards the opening sidewalls and form silicon-carbon bonding at the sidewalls, and thereby rebuild the sidewall surfaces. This adjustment at the sidewalls of the openings advantageously provides improved sidewall surface composition for the metal fill process.

During the curing process, at least a percentage of the degradable porogens 111 of insulating layer 110 and ERF 112, may transition into a gaseous phase and migrate or bubble out from the structure, thereby leaving the depicted structure. For example, gas formed from porogens 111 in insulating layer 110 may migrate through ERF 112 to escape the structure. Resultant pores 111' may be filled either with air or another gas, or may have a partial vacuum therein, depending on the process conditions used. Because the dielectric constant of air or a vacuum is approximately one (1), the formation of pores 111' also serves to reduce the effective dielectric constant of the resultant interlayer structure. In one example, the dielectric constant of interlayer structure may be between 2.5 and 2.7; while in another example, the dielectric constant of interlayer structure may be below 2.5. Therefore, interlayer structure, which had an initial capacitance before the curing process, will have a final capacitance after curing that is lower than the initial capacitance, and in one example may be 50% of the initial capacitance. As is known in the art, the capacitance of, for example, a parallel plate capacitor is proportional to the dielectric constant. With the plates of the parallel capacitor being, in this case, adjacent metal layers or levels of the integrated circuit.

Figure 1H:
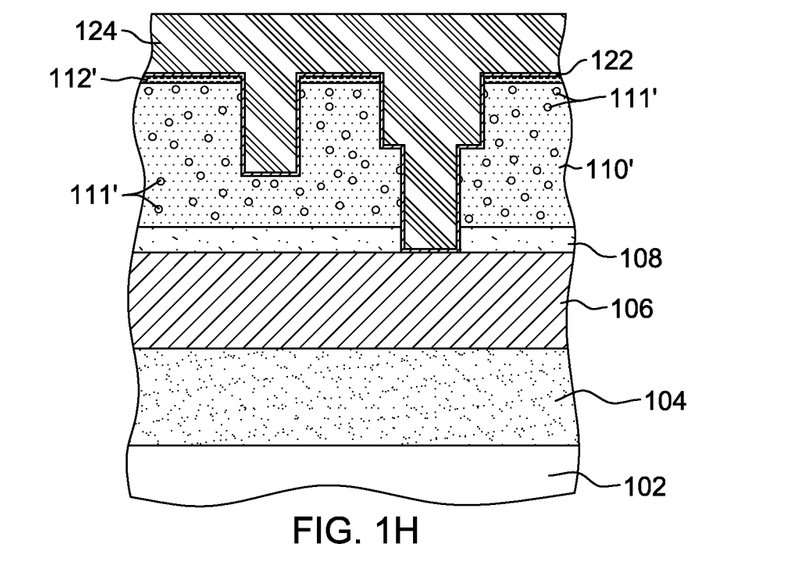
FIG. 1H depicts the structure of FIG. 1G after over filling the one or more openings with a conductive material, in accordance with one or more aspects of the present invention.

FIG. 1H depicts the structure of FIG. 1G after providing metal fill within the openings and over-filling the structure. By way of example, the metal fill may be provided by barrier and seed deposition (BSD) and electrochemical plating (ECP), as one example. In one example, the conductive structures 120 may include a liner(s) 122 deposited into openings 120. The liner refers generally to any film or layer which may include part of the conductive structure, and include (for instance) one or more conformally-deposited layers, which may include titanium (Ti), carbon-doped titanium, tungsten (W), a tungsten-nitride (WN), titanium-nitride (TiN), tantalum-nitride (TaN), titanium aluminum-nitride (TiAlN), and the like. Liners 122 may be deposited using ALD, CVD, or any other suitable process, and facilitate the formation of conductive structures 124 by partially filling the openings. Because cured insulating layer 110' has substantially smooth sidewalls at the openings 120 (FIG. 1G), there is reduced risk of liner material 122 migrating into the insulating layer, which could otherwise reduce performance and increase leakage of the integrated circuits. Conductive structures 124 formed within the openings 120 may extend, for instance, through the insulating layer and the protective hard mask 108 to metal layer 106.

Figure 1I:
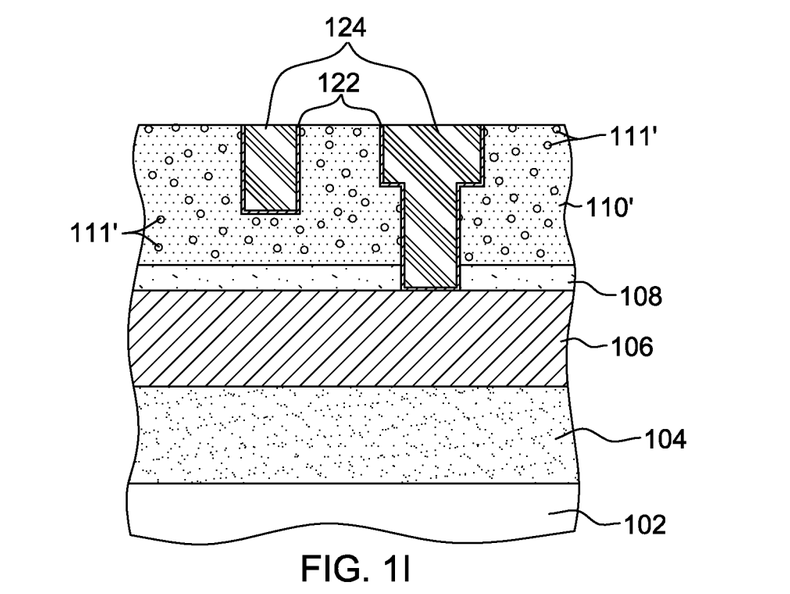
FIG. 1I depicts the structure of FIG. 1H after planarizing the conductive material using the reduced energy removal film as an etch stop, in accordance with one or more aspects of the present invention.

As shown in FIG. 1I, chemical-mechanical polishing may be employed to planarize the structure, with the reduced ERF 112' acting as a CMP polish stop layer for the process. This advantageously provides better metal resistance uniformity across the structure.

Figure 1J:
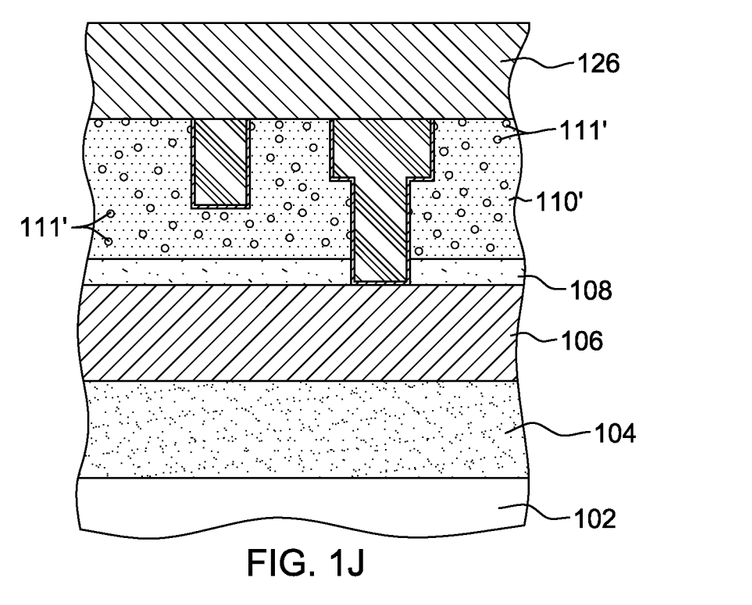
FIG. 1J depicts the structure of FIG. 1I after provision of another metal layer over the structure, wherein the conductive structure(s) provides, in part, electrical connection between the another metal layer and the underlying metal layer, in accordance with one or more aspects of the present invention.

FIG. 1J illustrates the structure of FIG. 1I after another metal layer 126 has been disposed over the interlayer structure and conductive structures 124. As depicted, one or more conductive structures 124 facilitate electrical connection between metal layer 126 and metal layer 106, and in so doing, facilitates electrical connection between metal layer 126 and device layer 104. In an integrated circuit fabrication process, there could be, for instance, between six to ten metal layers, with additional interlayer structures formed between each adjacent metal layer. After forming metal layer 126, for example, another interlayer structure could be formed above metal layer 126, using the processing steps previously described herein to achieve a reduced capacitance for those layers, used as described.

Figure 2:
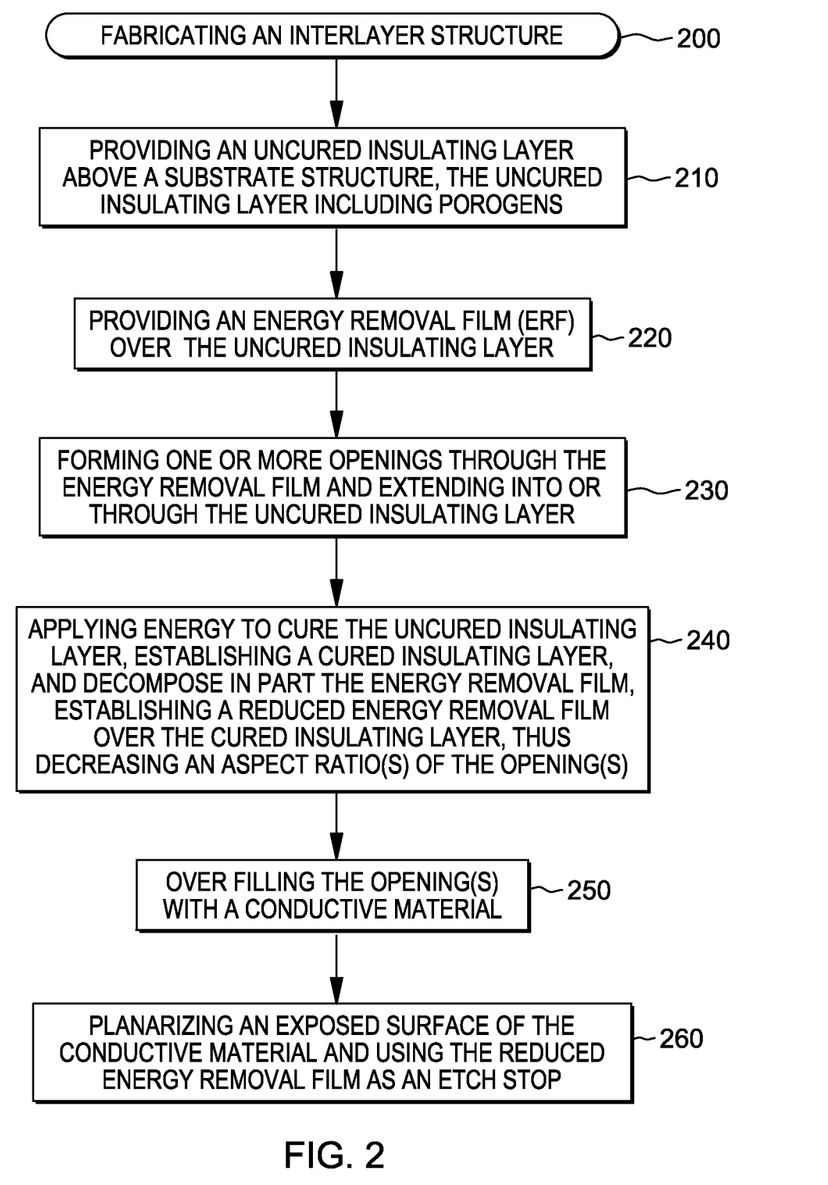
FIG. 2 depicts one embodiment of a process for fabricating an interlayer structure, in accordance with one or more aspects of the present invention.

By way of summary, FIG. 2 illustrates an overview of one embodiment of a process of fabricating an interlayer structure, in accordance with one or more aspects of the present invention. As illustrated, fabricating the interlayer structure 200 includes: providing an uncured insulating layer above a substrate structure, the uncured insulating layer including porogens 210; providing an energy removal film over the uncured insulating layer 220; forming one or more openings through the energy removal film and extending into or through the uncured insulating layer 230; applying energy to cure the uncured insulating layer, establishing a cured insulating layer, and decomposing in part the energy removal film, establishing a reduced energy removal film over the cured insulating layer, thus decreasing an aspect ratio(s) of the opening(s) 240; over-filling the opening with a conductive material 250; and planarizing an exposed surface of the interlayer structure using the reduced energy removal film as a polish stop layer 260.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing an interlayer structure comprising:
   providing an uncured insulating layer above a substrate structure;
   forming an energy removal film over the uncured insulating layer;
   forming at least one opening through the energy removal film and extending at least partially into the uncured insulating layer; and
   applying energy to cure the uncured insulating layer and form a cured insulating layer, and to decompose in part the energy removal film and form a reduced thickness energy removal film over the cured insulating layer so as to decrease an aspect ratio of the at least one opening, wherein the interlayer structure comprises the cured insulating layer.

2. The method of claim 1, wherein providing the interlayer structure further comprises, after applying the energy, over filling the at least one opening with a conductive material.

3. The method of claim 2, wherein providing the interlayer structure further comprises planarizing an exposed surface of the interlayer structure after the over filling of the at least one opening with the conductive material.

4. The method of claim 3, wherein providing the interlayer structure further comprises using the reduced thickness energy removal film as an etch stop for the planarizing.

5. The method of claim 4, wherein the reduced thickness energy removal film is 10 nanometers or less in thickness and is removed by the planarizing of the exposed surface of the interlayer structure.

6. The method of claim 1, wherein providing the interlayer structure further comprises providing a conductive material within the at least one opening to form a conductive structure, and the substrate structure comprises a metal layer disposed above a substrate of the substrate structure, the conductive structure extending, at least in part, to the metal layer.

7. The method of claim 6, further comprising disposing another metal layer over the interlayer structure, wherein the conductive structure facilitates electrical connection between the metal layer and the another metal layer.

8. The method of claim 7, wherein the substrate structure further comprises a device layer disposed below the metal layer, and wherein the conductive structure facilitates electrical connection between the another metal layer and the device layer.

9. The method of claim 1, wherein the uncured insulating layer comprises one of a low-k dielectric material or an ultra-low-k dielectric material with porogens.

10. The method of claim 9, wherein the cured insulating layer has an effective dielectric constant of 2.5 or less.

11. The method of claim 9, wherein the uncured insulating layer comprises a porogen and matrix material, and wherein porogens of the uncured insulating layer decompose, at least partially, during the applying energy.

12. The method of claim 11, wherein the porogens of the uncured insulating layer comprise a C-based polymer material, and the matrix material comprises an Si-based material.

13. The method of claim 9, wherein the cured insulating layer has a reduced thickness compared with a thickness of the uncured insulating layer, further decreasing the aspect ratio(s) of the at least one opening.

14. The method of claim 12, wherein the energy removal film decomposes to a greater degree than the uncured insulating film during the applying energy.

15. The method of claim 1, wherein the cured insulating layer has a reduced thickness compared with a thickness of the uncured insulating layer, further decreasing the aspect ratio(s) of the at least one opening.

16. The method of claim 15, wherein the applying energy reduces thickness of the energy removal film a greater percentage than the applying energy reduces thickness of the uncured insulating layer.

17. The method of claim 1, wherein the applying energy results in the reduced energy removal film having a reduced thickness that is less than 50% a thickness of the energy removal film prior to the applying energy.

18. The method of claim 1, wherein the energy removal film comprises a C-based polymer material.

19. The method of claim 1, wherein the forming the energy removal film comprises forming the energy removal film from at least one of a photonic decomposable material, a thermal decomposable material, an e-beam decomposable material, or a combination thereof.

20. The method of claim 1, wherein the applying energy comprises utilizing one or more of thermal energy, x-ray energy, ultraviolet light energy or infrared light energy.

* * * * *